(12) United States Patent
Wang et al.

(10) Patent No.: US 12,484,348 B2
(45) Date of Patent: Nov. 25, 2025

(54) SUBSTRATE, METHOD FOR FORMING THE SAME, DISPLAY DEVICE AND FOR FORMING THE SAME

(71) Applicant: BOE Technology Group Co., Ltd., Beijing (CN)

(72) Inventors: Meili Wang, Beijing (CN); Qi Qi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 720 days.

(21) Appl. No.: 17/784,437

(22) PCT Filed: Jul. 6, 2021

(86) PCT No.: PCT/CN2021/104720
§ 371 (c)(1),
(2) Date: Jun. 10, 2022

(87) PCT Pub. No.: WO2022/042051
PCT Pub. Date: Mar. 3, 2022

(65) Prior Publication Data
US 2023/0006107 A1    Jan. 5, 2023

(30) Foreign Application Priority Data

Aug. 28, 2020 (CN) .................. 202010883934.X (51) Int. Cl.
*H10H 20/85* (2025.01)
*H10H 20/01* (2025.01)
*H10H 20/857* (2025.01)

(52) U.S. Cl.
CPC ........ *H10H 20/8506* (2025.01); *H10H 20/01* (2025.01); *H10H 20/857* (2025.01); *H10H 20/0364* (2025.01)

(58) Field of Classification Search
CPC ........... H01L 24/81; H01L 2224/14104; H01L 2224/1411; H01L 2224/16221;
(Continued)

(56) References Cited

U.S. PATENT DOCUMENTS 6,281,106 B1 * 8/2001 Higdon ................ H05K 3/3436
257/E21.511
6,638,847 B1 * 10/2003 Cheung ................ B23K 35/262
438/597

(Continued)

FOREIGN PATENT DOCUMENTS

| CN | 101567353 A | 10/2009 |
| CN | 101859733 A | 10/2010 |

(Continued)

OTHER PUBLICATIONS

Dan Maloney, "What the Flux: How Does Solder Work Anyway?", https://hackaday.com/2017/02/23/what-the-flux-how-does-solder-work-anyway/ (Year: 2017).*

(Continued)

*Primary Examiner* — Syed I Gheyas
(74) *Attorney, Agent, or Firm* — IPro, PLLC (57) ABSTRACT

A substrate includes a base substrate, at least two bonding pads are arranged on the base substrate, the base substrate and an electronic element are bonded to each other through the at least two bonding pads, at least two pins are arranged on the electronic element, a protective layer is arranged at a side of the bonding pads away from the base substrate, and an opening region is arranged in the protective layer at each bonding pad, to expose partial surface of the bonding pad. A bonding combination layer made of a low-melting-point alloy material is arranged in the opening region, and the low-melting-point alloy material is capable of being melted (Continued)

at a first predetermined temperature, to enable the bonding pads and the pins to be bonded to each other.

12 Claims, 4 Drawing Sheets

(58) Field of Classification Search
CPC .. H10H 20/8506; H10H 20/01; H10H 20/857; H10H 20/0364
See application file for complete search history.

(56) References Cited

U.S. PATENT DOCUMENTS

| | | |
|---|---|---|
| 2009/0250814 A1 | 10/2009 | Pendse et al. |
| 2013/0082091 A1* | 4/2013 | Matejat ................... H01L 24/11 228/176 |
| 2018/0090459 A1 | 3/2018 | Kim et al. |

FOREIGN PATENT DOCUMENTS

| | | |
|---|---|---|
| CN | 103026476 A | 4/2013 |
| CN | 107887358 A | 4/2018 |

OTHER PUBLICATIONS

PCT/CN2021/104720 international search report and written opinion.

* cited by examiner

SUBSTRATE, METHOD FOR FORMING THE SAME, DISPLAY DEVICE AND FOR FORMING THE SAME

CROSS-REFERENCE TO RELATED APPLICATIONS

This application is the U.S. national phase of PCT Application No. PCT/CN2021/104720 filed on Jul. 6, 2021, which claims priority to the Chinese patent application No. 202010883934.X filed in China on Aug. 28, 2020, which is incorporated herein by reference in its entirety.

TECHNICAL FIELD

The present disclosure relates to the field of substrates, in particular to a substrate, a method for forming the substrate, a display device and a method for forming the display device.

BACKGROUND

In the related art, a Micro LED and a Mini LED have been widely used in the fields of display and backlight.

SUMMARY

An object of the embodiments of the present disclosure is to provide a substrate, a method for forming the substrate, a display device and a method for forming the display device, so as to combine the advantages of solder paste welding and eutectic welding, thereby to provide a substrate bonding manner with high position accuracy, low temperature and without applying a pressure, and having good compatibility with a process of a display device in the field of display.

The technical solutions in the embodiments of the present disclosure are as follows.

In one aspect, a substrate is provided, including a base substrate, at least two bonding pads are arranged on the base substrate, the base substrate and an electronic element are bonded to each other through the at least two bonding pads, at least two pins are arranged on the electronic element, a protective layer is arranged at a side of the bonding pads away from the base substrate, and an opening region is arranged in the protective layer at each bonding pad, to expose partial surface of the bonding pad. A bonding combination layer made of a low-melting-point alloy material is arranged in the opening region, and the low-melting-point alloy material is capable of being melted at a first predetermined temperature, to enable the bonding pads and the pins to be bonded to each other.

In a possible embodiment of the present disclosure, the following relationships are met among the low-melting-point alloy material, a material that the bonding pads are made of and a material that the pins are made of: the low-melting-point alloy material is melted to dissociate a metal ion at the first predetermined temperature, the metal ion reacts with the material that the bonding pads are made of, to form a compound, and the metal ion reacts with the material that the pins are made of, to form a compound.

In a possible embodiment of the present disclosure, the low-melting-point alloy material is formed by doping a low-melting-point metal having a melting point lower than a predetermined value with at least one of silver, copper, bismuth, zinc, indium, antimony or lead.

In a possible embodiment of the present disclosure, the low-melting-point metal includes tin, and the low-melting-point alloy material includes: at least one of a tin-silver alloy, a tin-silver-copper alloy, a tin-zinc alloy, a tin-zinc-bismuth alloy, a tin-bismuth alloy, a tin-bismuth-silver alloy, a tin-copper alloy, or a ternary alloy formed by doping a tin-copper alloy with nickel, gold or silver.

In a possible embodiment of the present disclosure, the bonding pads are made of at least one of gold, silver, copper or tin, and the pins are made of at least one of gold, silver, copper or tin.

In a possible embodiment of the present disclosure, the bonding combination layer has a thickness of 0.5 μm to 4 μm in a direction perpendicular to the base substrate.

In a possible embodiment of the present disclosure, an area of an orthogonal projection of the opening region onto the base substrate is less than an area of an orthogonal projection of each bonding pad onto the base substrate.

In a possible embodiment of the present disclosure, the first predetermined temperature is less than or equal to 250° C.

In another aspect, a display device is further provided, including: the above-mentioned substrate, and the electronic element. At least two pins are arranged on the electronic element, and the pins of the electronic element and the bonding pads of the base substrate are bonded to each other when the bonding combination layer is melted.

In a possible embodiment of the present disclosure, the electronic element includes a LED chip.

In another aspect, a method for forming the above-mentioned substrate is further provided, including: providing the base substrate, forming at least two bonding pads on the base substrate, forming the protective layer at the side of the bonding pads away from the base substrate, patterning the protective layer to form the opening region at each bonding pad, forming a low-melting-point alloy layer made of the low-melting-point alloy material at a side of the protective layer away from the base substrate, where at least a portion of the low-melting-point alloy layer is located in the opening region and at least another portion covers the protective layer, and patterning the low-melting-point alloy layer to form the bonding combination layer in the opening region.

In a possible embodiment of the present disclosure, the forming the low-melting-point alloy layer made of the low-melting-point alloy material at the side of the protective layer away from the base substrate, includes: depositing and forming the low-melting-point alloy layer at the side of the protective layer away from the base substrate through magnetron sputtering.

In a possible embodiment of the present disclosure, the patterning the low-melting-point alloy layer to form the bonding combination layer in the opening region, includes: applying a photoresist onto the low-melting-point alloy layer, exposing the photoresist by using a mask to form a photoresist unreserved region and a photoresist reserved region, where the photoresist reserved region corresponds to a region where a pattern of the bonding combination layer is located, and the photoresist unreserved region corresponds to a region other than the pattern, performing a developing process, to fully remove the photoresist at the photoresist unreserved region, and maintain a thickness of the photoresist at the photoresist reserved region, where the low-melting-point alloy layer at the photoresist unreserved region is fully etched off through an etching process, to form the pattern of the bonding combination layer, and removing the remaining photoresist.

In another aspect, a method for forming the above-mentioned display device is further provided, including:

obtaining the substrate by using the above-mentioned method, transferring the electronic element onto the substrate, to enable the pins of the electronic element to be aligned with the bonding combination layer on the bonding pads of the substrate, and heating to a second predetermined temperature, to enable the low-melting-point alloy material of the bonding combination layer to be melted, and enable the bonding pads and the pins to be bonded to each other, where the second predetermined temperature is greater than or equal to the first predetermined temperature.

In a possible embodiment of the present disclosure, the second predetermined temperature is 10° C.-50° C. higher than the first predetermined temperature.

The embodiments of the present disclosure have the following beneficial effects.

In the substrate, the method for forming the substrate, the display device and the method for forming the display device, it is able to combine the advantages of the solder paste welding and eutectic welding, a protective layer is formed at a pad region of the substrate, the opening region is provided in the protective layer at each bonding pad in the pad region, and the low-melting-point alloy material is deposited in the opening regions to form the bonding combination layer, so as to realize the bonding between the electronic element and the substrate at a low temperature. In the embodiments of the present disclosure, a screen printing process is not required, and it is able to provide precise position accuracy of the bonding combination layer through patterning the protective layer on the substrate. In addition, the bonding combination layer is made of the low-melting-point alloy material, so it is able to achieve the low-temperature bonding without applying a pressure, thereby to reduce a damage rate of the electronic element. Moreover, the bonding combination layer made of the low-melting-point alloy material is formed by using an Array (array substrate) process, so it is able to improve the efficiency and reduce a probability that the bonding pads on the substrate are oxidized.

DETAILED DESCRIPTION

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before the detailed description on the embodiments of the present disclosure, it is necessary to describe the related art as follows.

Figure 1:
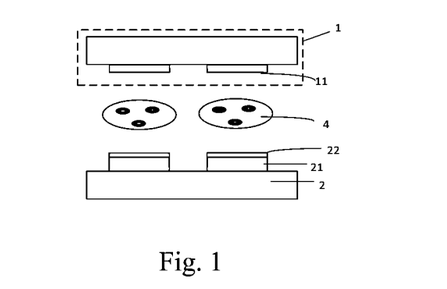
FIG. 1 is a schematic view showing a case where a LED chip is bonded to a substrate through solder paste welding in the related art.

As shown in FIG. 1, a chip 1 includes two pins 11, bonding pads 21 are provided on the substrate 2 that is to be bonded with an inorganic light-emitting diode chip, i.e., the chip 1. A mature and stable process for achieving the bonding between the chip 1 and the pads 21 is reflow soldering, the pins 11 of the chip 1 are usually made of gold, and the pads 21 to be bonded to the chip are usually made of copper. However, copper is easily oxidized, which adversely affects a bonding effect, and therefore an anti-oxidation layer 22 is usually formed on a surface of the copper. In addition, it is necessary to print a solder paste 4 on the pads before the reflow soldering, but the accuracy of the printing process is low, it is found that the yield is low in the case that a large number of chips are bonded through printing in a high PPI (Pixels Per Inch) display device.

Figure 2:
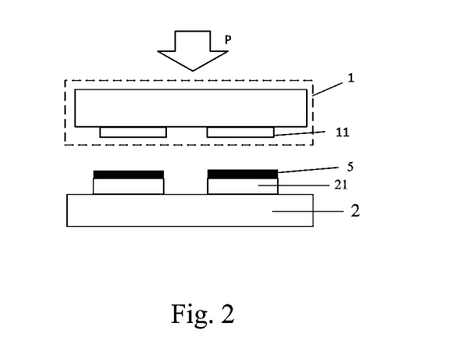
FIG. 2 is a schematic view showing a case where the LED chip is bonded to the substrate through eutectic welding in the related art.

Another process for bonding chips is eutectic welding. As shown in FIG. 2, a low-melting-point metal 5, such as indium (In) and tin (Sn), is formed on the pads 21. Under the effect of temperature and pressure, the low-melting-point metal 5 is melted and forms an In/Au alloy or Sn/Au alloy having a predetermined proportion with the material of the pins 11 of the chip 1, such as gold (Au), thereby to achieve the bonding. However, a pressure value of 0.1 MPa to 0.5 MPa is required, and crack easily occurs in a chip having a size below 100 μm under the pressure. In addition, low-melting-point metal pads made of such as indium or tin are required to be formed through a plating process, which is difficult to be compatible with other processes.

In order to address the above technical issues, a substrate, a method for forming the substrate, a display device and a method for forming the display device are provided in the embodiments of the present disclosure, so as to combine the advantages of the solder paste welding and the eutectic welding, thereby to provide a substrate bonding manner with high position accuracy, low temperature and without pressure, and having good compatibility with a process of a display device in the field of display.

Figure 3:
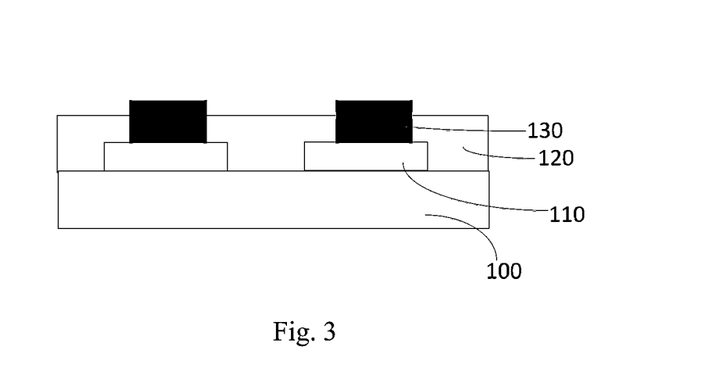
FIG. 3 is a schematic view showing a substrate according to an embodiment of the present disclosure.
Figure 4:
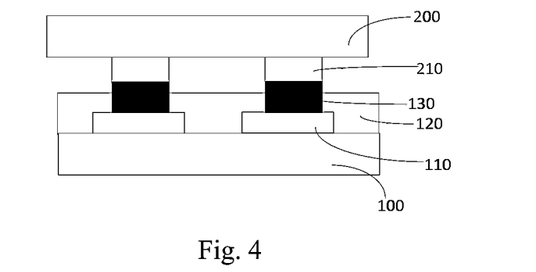
FIG. 4 is a schematic view showing a display device according to an embodiment of the present disclosure.

As shown in FIGS. 3 and 4, the substrate is provided, including a base substrate 100, at least two bonding pads 110 are arranged on the base substrate 100, and at least two pins 210 are arranged on the electronic element 200, a protective layer 120 is arranged at a side of the bonding pads 110 away from the base substrate 100, and an opening region 121 is arranged in the protective layer 120 at each bonding pad 110, to expose partial surface of the bonding pad 110. A bonding combination layer 130 made of a low-melting-point alloy material is arranged in the opening region 121, and the low-melting-point alloy material is capable of being melted at a first predetermined temperature to enable the bonding pads 110 and the pins 210 to be bonded to each other, where the first predetermined temperature may optionally range from 110° C. to 300° C.

In the substrate of the embodiments of the present disclosure, the protective layer 120 is formed at a pad region of the substrate, the opening region 121 is provided in the protective layer 120 at each bonding pad 110 in the pad region, and the low-melting-point alloy material is deposited in the opening regions to form the bonding combination layer 130, so as to realize the bonding between the electronic element 200 and the substrate at a low temperature.

In the embodiments of the present disclosure, the bonding combination layer 130 is formed through depositing the low-melting-point alloy material in the opening region 121 provided in the protective layer 120, as compared with a scheme of forming the solder paste through the screen printing process, it is able to provide a high accuracy through patterning the protective layer 120 on the substrate, and the position accuracy of the bonding combination layer 130 may be determined by an opening position accuracy of the opening region 121 in the protective layer 120, so it is able to improve the position accuracy of the bonding combination layer 130 through patterning the protective layer 120 on the substrate, thereby facilitate the control of the position accuracy, and realize a high-accuracy bonding.

As compared with the bonding process in the related art, in order to prevent the metal that the pads are made of from being oxidized, the anti-oxidation layer made of a conductive material (for example, a transparent conductive material such as indium tin oxide or nickel gold oxide) is required to be formed at each pad. In the embodiments of the present disclosure, the protective layer 120 which only exposes the surface of each bonding pad is formed on each bonding pad 110 by using an insulating material, and a bonding material is directly deposited on the bonding pads to form the bonding combination layer 130, so as to provide both may anti-oxidation and bonding effects though the bonding combination layer, thereby to reduce a probability that the bonding pads on the substrate are oxidized and save costs at the same time.

In the eutectic welding process shown in FIG. 2, the pins 11 of the chip 1 and the pads 21 of the substrate 2 are bonded to each other through metal diffusion of a metal material (such as gold, indium) at a high temperature and a high pressure. In the reflow soldering process shown in FIG. 1, when the low-melting-point alloy material (e.g., solder paste) is used for bonding the chip, bonding may be achieved in a well manner without applying a pressure. Therefore, in the embodiments of the present disclosure, through depositing the low-melting-point alloy material on the pads, it is able to enable the low-melting-point alloy material to be melted at a low-temperature condition and without applying a pressure, thereby to enable the low-melting-point alloy material and the pins of the chip to be bonded to each other quickly. In other words, in the embodiments of the present disclosure, the bonding combination layer 130 is made of the low-melting-point alloy material, and the low-melting-point alloy material may be melted at a low temperature lower than the first predetermined temperature, and permeates into the materials of the bonding pads 110 and the pins 210, so as to achieve the low-temperature bonding without applying a pressure. As compared with the eutectic welding in the related art, it is able to reduce the damage rate of the electronic element 200, and the bonding combination layer 130 made of the low-melting-point alloy material is formed by using an array process, so it is able to improve the efficiency and provide a substrate bonding manner having good compatibility with the process of the display device in the field of display.

In some embodiments of the present disclosure, the protective layer 120 may be made of an inorganic material or an organic material. For example, the protective layer 120 may be made of such inorganic material as silicon oxide, silicon nitride, or may be made of various organic materials that may be used to form a planarization layer, such as resin.

As shown in FIG. 3, a thickness of the protective layer 120 in a direction perpendicular to the base substrate 100 is less than a thickness of the bonding combination layer 130 in the direction perpendicular to the base substrate 100. In other words, a height of the bonding combination layer 130 is larger than a height of the protective layer 120, and the bonding combination layer 130 is at least partially exposed at a side of the protective layer 120 away from the base substrate 100, so it is able to ensure that a bonding interface between the bonding combination layer 130 and the pins 210 on the electronic element 200 is not affected by the protective layer 120, thereby to ensure a bonding effect. In some exemplary embodiments of the present disclosure, the following relationships are met among the low-melting-point alloy material, a material that the bonding pads 110 are made of and a material that the pins 210 are made of: the low-melting-point alloy material is melted to dissociate a metal ion at the first predetermined temperature, the metal ion reacts with the material that the bonding pads 110 are made of, to form a compound, and the metal ion reacts with the material that the pins 210 are made of, to form a compound, so as to realize the eutectic bonding.

In the above-mentioned embodiments, the low-melting-point alloy material is capable of being melted at a low temperature, and diffusing and permeating into the bonding pads 110 and the pins 210, so as to achieve the eutectic bonding.

The low-melting-point alloy material is formed by doping a low-melting-point metal having a melting point lower than a predetermined value with at least one of silver (Ag), copper (Cu), bismuth (Bi), zinc (Zn), indium (In), stibium (Sb) or lead (Pb).

It should be appreciated that the low-melting-point metal is referred to as a metal having a melting point less than 300° C. at an atmospheric pressure (0 MPa), i.e., the predetermined value is 300° C. Illustratively, the low-melting-point metal includes tin (Sn), and the low-melting-point alloy material includes: at least one of a tin-silver (Sn—Ag) alloy, a tin-silver-copper (Sn—Ag—Cu) alloy, a tin-zinc (Sn—Zn) alloy, a tin-zinc-bismuth (Sn—Zn—Bi) alloy, a tin-bismuth (Sn—Bi) alloy, a tin-lead (Sn—Pb) alloy, a tin-bismuth-silver (Sn—Bi—Ag) alloy, a tin-copper (Sn—Cu) alloy, and a ternary alloy formed by doping the tin-copper (Sn—Cu) alloy with nickel (Ni), gold (Au) or silver (Ag).

Illustratively, the low-melting-point X alloy material is formed by doping a low-melting-point X metal with other metal materials, the bonding pads are made of Y metal, and the pins are made of Z metal. After the low-melting-point alloy material is melted at a low temperature, X metal ions diffuse to a surface of the Y metal of the bonding pads, to form a compound YmXn, where m and n are each an integer greater than or equal to 1, and X metal ions diffuse to a surface of the Z metal of the pins, to form a compound ZaXb, where a and b are each an integer greater than or equal to 1.

For example, the bonding pads 110 are made of at least one of gold (Au), silver (Ag), copper (Cu) or tin (Sn), and the pins 210 are made of at least one of gold (Au), silver (Ag), copper (Cu), or tin (Sn).

Illustratively, an alloy composition and the melting point of the low-melting-point alloy material may be shown in the following Table 1.

TABLE 1

| alloy composition | melting point(° C.) |
| --- | --- |
| Sn—37Pb | 183 |
| Sn—58Bi | 138 |
| Sn—20In—2.8Ag | 179-189 |
| Sn—10Bi—5Zn | 168-190 |
| Sn—8.8Zn | 198.5 |
| Sn—3.5Ag—4.8Bi | 205-210 |
| Sn—7.5Bi—2Ag—0.5Cu | 213-218 |
| Sn95.8\Ag3.5\Cu0.7 | 217-218 |
| Sn—3.5Ag—1.5In | 218 |
| Sn96.5\Ag3.0\Cu0.5 | 216-220 |
| Sn—3.5Ag | 221 |
| Sn—2Ag | 221-226 |
| Sn—0.7Cu—Ni | 227 |
| Sn—5Sb | 232-240 |

It should be appreciated that the low-melting-point alloy material is referred to as the low-melting-point metal having the melting point less than 300° C. and an alloy thereof, and is mainly composed of such low-melting-point metal as Bi, Sn, Pb and In. In the embodiments of the present disclosure, the low-melting-point alloy material has the melting point less than or equal to 250° C., i.e., the first predetermined temperature is less than or equal to 250° C.

It should be further appreciated that, in Table 1, the alloy composition refers to a mass percentage of each composition. For example, Sn-37Sb means that a mass percentage of Sn is 63%, and a mass percentage of Sb is 37%. Sn-58Bi means that a mass percentage of Sn is 42%, and a mass percentage of Bi is 58%. Sn-20In-2.8Ag means that a mass percentage of Sn is 77.2%, a mass percentage of In is 20%, and a mass percentage of Ag is 2.8%.

It should be appreciated that the above are for illustrative purposes only, and in practical applications, the specific composition of the low-melting-point alloy material may be not be limited thereto.

In addition, it should be appreciated that the tin-silver (Sn—Ag) alloy has a characteristic of high strength, the tin-copper (Sn—Cu) alloy has a characteristic of low cost, the tin-bismuth (Sn—Bi) alloy has a characteristic of low-melting point, and the tin-zinc (Sn—Zn) alloy has a characteristic of strong oxidation. In practical applications, the low-melting-point alloy material may be selected according to practical needs.

Taking a case where the low-melting-point alloy material is the tin-lead (Sn—Pb) alloy, and the bonding pads and the pins are each made of copper (Cu) as an example, at 210° C. to 230° C., Sn is melted and diffuses to a surface of Cu, while Pb does not diffuse, and Cu6Sn5 is mainly formed. Along with the increase in temperature and time, more Cu is melted into the Cu6Sn5, and Cu3Sn is locally formed, so as to achieve the bonding.

Figure 9:
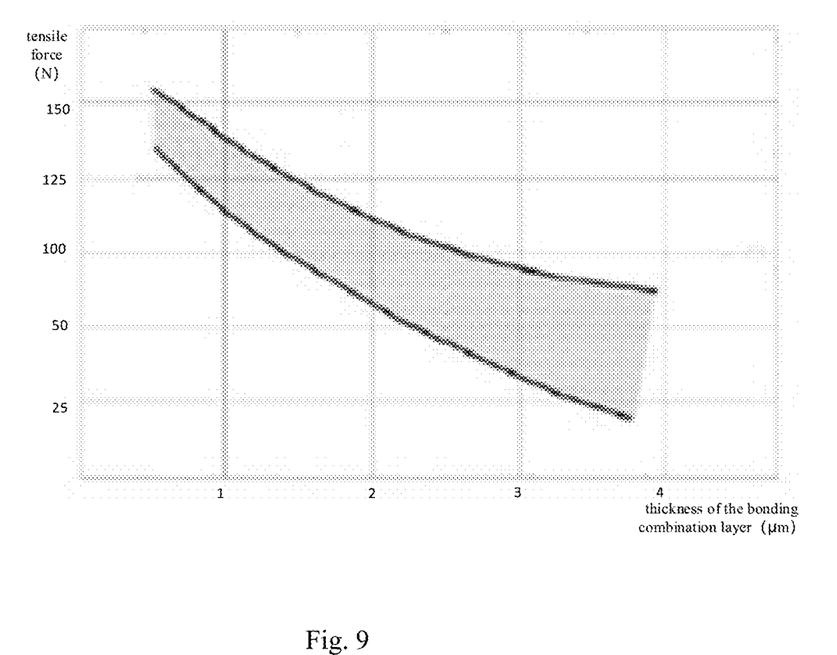
FIG. 9 is a curve diagram showing a relationship between a thickness of the bonding combination layer and bonding stability.

FIG. 9 is a curve diagram showing a relationship between a thickness of the bonding combination layer 130 and bonding stability. Taking the bonding stability of the bonding combination layer 130 into consideration, the combination layer 130 has a thickness of 0.5 μm to 4 μm in a direction perpendicular to the base substrate 100. It should be appreciated that, in practical applications, the actual thickness of the bonding combination layer 130 may be selected according to actual needs.

As shown in FIGS. 3 and 4, in some exemplary embodiments of the present disclosure, an area of an orthogonal projection of the opening region 121 onto the base substrate 100 is less than an area of an orthogonal projection of each bonding pad 110 onto the base substrate 100.

In the above-mentioned solution, the bonding combination layer 130 in the opening region 121 is bonded to the pins 210 on the electronic element, the area of the opening region matches an area of each pin 210, the area of the orthogonal projection of each bonding pad 110 on the base substrate is greater than the area of the orthogonal projection of the opening region 121 on the base substrate, the orthogonal projection of the opening region 121 onto the base substrate fully falls within the orthogonal projection of each bonding pad 110 onto the base substrate, and other parts of each bonding pad 110 rather than a portion coinciding with the opening region may also be coupled to other circuit portions through welding.

It should be appreciated that the substrate may be, but not limited to, a substrate where a driving circuit is formed in the display device, and the electronic element 200 maybe, but not limited to, a LED chip.

In addition, in the related art, the pin of the LED chip is generally of a gold enclosing nickel structure, a main body of the pin is made of nickel and gold is applied onto the main body in an enclosing manner through plating, so as to prevent nickel from being oxidized. A detailed description is given through two tests on the eutectic bonding between the low-melting-point alloy material and the bonding pads of a gold enclosing copper structure (i.e., the copper bonding pads are enclosed with a gold anti-oxidation layer) at a low temperature without applying a pressure.

Test 1: a substrate and an electronic element are provided, and the bonding pads on the substrate are of a gold enclosing copper structure, i.e., the pads are made of copper, and gold is applied onto the copper in an enclosing manner. The electronic element is a LED chip having a length of 0.06 inch, a width of 0.04 inch, and a thickness of 5 μm to 10 μm, and two pins on the LED chip are an N electrode and a P electrode that are of a gold enclosing nickel structure.

A Sn—Ag alloy of 8 μm to 15 μm is applied onto two pins of the LED chip through plating, and the eutectic bonding is realized at a temperature of 220° C. to 250° C. and without applying a pressure. Alternatively, the eutectic bonding between the substrate and the electronic element may be achieved through applying the Sn—Ag alloy of 8 μm to 15 μm onto the bonding pads of the substrate through plating at the temperature of 220° C. to 250° C. and without applying a pressure.

Test 2: the substrate and the electronic element are provided, and the bonding pads on the substrate are of a gold enclosing copper structure, i.e., the pads are made of copper, and gold is applied onto the copper in an enclosing manner. The electronic element is a LED chip having a length of 0.06 inch, a width of 0.04 inch, and a thickness of 5 µm to 10 µm, and the two pins on the LED chip are an N electrode and a P electrode that are of a gold enclosing nickel structure.

A Sn—Ag—Cu alloy of 8 µm to 15 µm is applied onto two pins of the LED chip through plating, and the eutectic bonding is realized at a temperature of 220° C. to 250° C. Alternatively, the eutectic bonding may be achieved through applying the Sn—Ag—Cu alloy of 8 µm to 15 µm onto the bonding pads of the substrate through plating at the temperature of 220° C. to 250° C. and without applying a pressure.

It is able to verify through the above two tests that the low-temperature bonding between the low-melting-point alloy material and the bonding pads of the gold enclosing copper structure, and the low-temperature bonding between the low-melting-point alloy material and the pins of the gold enclosing nickel structure may be achieved at a temperature above an eutectic melting point and without applying a pressure, so as to achieve the low-temperature bonding between the substrate and the electronic element.

In addition, a display device is further provided in the embodiment of present disclosure, including: the above-mentioned substrate, and the electronic element 200. At least two pins 210 are arranged on the electronic element 200, and the pins 210 of the electronic element 200 and the bonding pads 110 of the base substrate are bonded to each other when the bonding combination layer 130 is melted.

Apparently, the display device also has the beneficial effects of the above-mentioned substrate, and thus will not be particularly defined herein.

It should be appreciated that, in the embodiment of the present disclosure, the display device, i.e., the substrate where a driving circuit is formed, may be applied in a display or backlight system, and the electronic element 200 may be, but not limited to, the LED chip, in particular, a Micro LED and a Mini LED chip.

In addition, a method for forming the above-mentioned substrate is further provided in the embodiments of the present disclosure, including the following steps.

Step S01, providing the base substrate 100.

Step S02, forming at least two bonding pads 110 on the base substrate 100.

Figure 5:
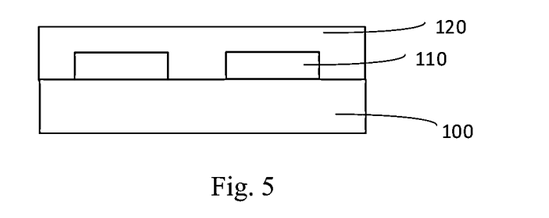
FIG. 5 is a schematic view showing step S03 in a method for forming the substrate according to an embodiment of the present disclosure.

Step S03, as shown in FIG. 5, forming the protective layer 120 at the side of the bonding pads 110 away from the base substrate 100.

Figure 6:
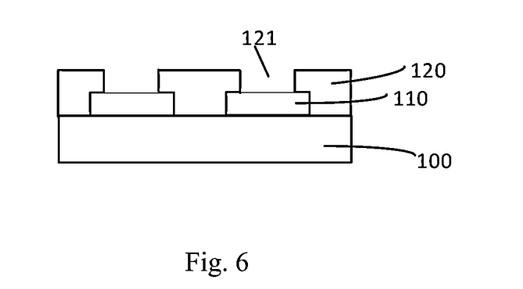
FIG. 6 is a schematic view showing step S04 in the method for forming the substrate according to an embodiment of the present disclosure.

Step S04, as shown in FIG. 6, patterning the protective layer 120, so as to form the opening region 121 at each bonding pad 110.

Figure 7:
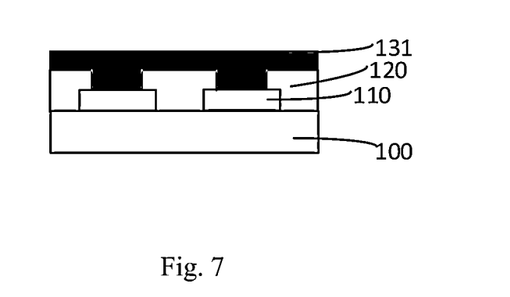
FIG. 7 is a schematic view showing step S05 in the method for forming the substrate according to an embodiment of the present disclosure.

Step S05, as shown in FIG. 7, forming a low-melting-point alloy layer 131 made of the low-melting-point alloy material at a side of the protective layer 120 away from the base substrate 100, where at least a portion of the low-melting-point alloy layer 131 is located in the opening region 121, and at least another portion covers the protective layer 120.

Figure 8:
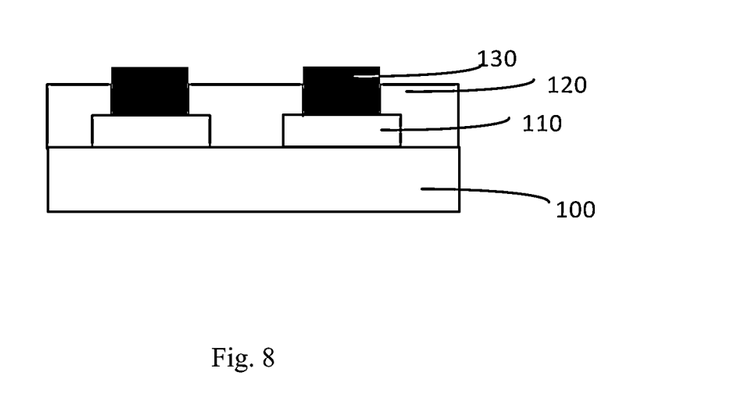
FIG. 8 is a schematic view showing step S06 in the method for forming the substrate according to an embodiment of the present disclosure.

Step S06, as shown in FIG. 8, patterning the low-melting-point alloy layer 131, to form the bonding combination layer 130 in the opening region 121.

Illustratively, step S05 specifically includes: depositing and forming the low-melting-point alloy layer 131 at the side of the protective layer 120 away from the base substrate 100 through magnetron sputtering.

In the above-mentioned scheme, since the process of forming the low-melting-point protective layer 120 is compatible with the array process, the low-melting-point protective layer 120 may be formed through magnetron sputtering.

Furthermore, step S06 specifically includes: applying a photoresist onto the low-melting-point alloy layer 131, exposing the photoresist by using a mask to form a photoresist unreserved region and a photoresist reserved region, where the photoresist reserved region corresponds to a region where a pattern of the bonding combination layer 130 is located, and the photoresist unreserved region corresponds to a region other than the bonding combination layer 130, performing a developing process, to fully remove the photoresist at the photoresist unreserved region, and maintain a thickness of the photoresist at the photoresist reserved region, where the low-melting-point alloy layer 131 at the photoresist unreserved region is fully etched off through an etching process, to form the pattern of the bonding combination layer 130, and removing the remaining photoresist.

In addition, a method for forming the above-mentioned display device is further provided in the embodiments of the present disclosure, i.e., a method for bonding the substrate and the electronic element 200 is further provided. The method includes the following steps.

Step S11, obtaining the substrate by using the above-mentioned method.

Step S12, transferring the electronic component 200 onto the substrate, to enable the pins 210 of the electronic element 200 to be aligned with the bonding combination layer 130 on the bonding pads 110 of the substrate.

Step S13, heating to a second predetermined temperature, to enable the low-melting-point alloy material of the bonding combination layer 130 to be melted, and enable the bonding pads 110 and the pins 210 to be bonded to each other, where the second predetermined temperature is greater than or equal to the first predetermined temperature.

In step S13, the second predetermined temperature is 10° C.-50° C. higher than the first predetermined temperature.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A method for forming a substrate, wherein the substrate comprises a base substrate,
wherein at least two bonding pads are arranged on the base substrate, the base substrate and an electronic element are bonded to each other through the at least two bonding pads, at least two pins are arranged on the electronic element, a protective layer is arranged at a side of the bonding pads away from the base substrate, and an opening region is arranged in the protective layer at each bonding pad, to expose partial surface of the bonding pad; a bonding combination layer made of a low-melting-point alloy material is arranged in the opening region, and the low-melting-point alloy material is capable of being melted at a first predetermined temperature, to enable the bonding pads and the pins to be bonded to each other; and wherein the method comprises providing the base substrate;

forming the at least two bonding pads on the base substrate;

forming the protective layer at the side of the bonding pads away from the base substrate;

patterning the protective layer to form the opening region at each bonding pad;

directly forming a low-melting-point alloy layer made of the low-melting-point alloy material at a side of the protective layer away from the base substrate, wherein at least a portion of the low-melting-point alloy layer is located in the opening region and at least another portion covers the protective layer; and patterning the low-melting-point alloy layer to form the bonding combination layer in the opening region.

2. The method according to claim 1, wherein the forming the low-melting-point alloy layer made of the low-melting-point alloy material at the side of the protective layer away from the base substrate, comprises:

depositing and forming the low-melting-point alloy layer at the side of the protective layer away from the base substrate through magnetron sputtering.

3. The method according to claim 1, wherein the patterning the low-melting-point alloy layer to form the bonding combination layer in the opening region, comprises:

applying a photoresist onto the low-melting-point alloy layer;

exposing the photoresist by using a mask to form a photoresist unreserved region and a photoresist reserved region; wherein the photoresist reserved region corresponds to a region where a pattern of the bonding combination layer is located, and the photoresist unreserved region corresponds to a region other than the pattern;

performing a developing process, to fully remove the photoresist at the photoresist unreserved region, and maintain a thickness of the photoresist at the photoresist reserved region; wherein the low-melting-point alloy layer at the photoresist unreserved region is fully etched off through an etching process, to form the pattern of the bonding combination layer; and removing the remaining photoresist.

4. A method for forming a display device, wherein the display device comprises the substrate and the electronic element according to claim 1, and the method comprises:

obtaining the substrate transferring the electronic element onto the substrate, to enable the pins of the electronic element to be aligned with the bonding combination layer on the bonding pads of the substrate; and heating to a second predetermined temperature, to enable the low-melting-point alloy material of the bonding combination layer to be melted, and enable the bonding pads and the pins to be bonded to each other, wherein the second predetermined temperature is greater than or equal to the first predetermined temperature.

5. The method according to claim 4, wherein the second predetermined temperature is 10° C.-50° C. higher than the first predetermined temperature.

6. The method according to claim 1, wherein the following relationships are met among the low-melting-point alloy material, a material that the bonding pads are made of and a material that the pins are made of: the low-melting-point alloy material is melted to dissociate a metal ion at the first predetermined temperature, the metal ion reacts with the material that the bonding pads are made of, to form a first compound, and the metal ion reacts with the material that the pins are made of, to form a second compound.

7. The method according to claim 1, wherein the low-melting-point alloy material is formed by doping a low-melting-point metal having a melting point lower than a predetermined value with at least one of silver, copper, bismuth, zinc, indium, antimony or lead.

8. The method according to claim 7, wherein the low-melting-point metal comprises tin, and the low-melting-point alloy material comprises: at least one of a tin-silver alloy, a tin-silver-copper alloy, a tin-zinc alloy, a tin-zinc-bismuth alloy, a tin-bismuth alloy, a tin-bismuth-silver alloy, a tin-copper alloy, and a ternary alloy formed by doping a tin-copper alloy with nickel, gold or silver.

9. The method according to claim 8, wherein the bonding pads are made of at least one of gold, silver, copper or tin, and the pins are made of at least one of gold, silver, copper or tin.

10. The method according to claim 1, wherein the first predetermined temperature is less than or equal to 250° C.

11. The method according to claim 1, wherein the bonding combination layer has a thickness of 0.5 µm to 4 µm in a direction perpendicular to the base substrate.

12. The method according to claim 1, wherein an area of an orthogonal projection of the opening region onto the base substrate is less than an area of an orthogonal projection of each bonding pad onto the base substrate.

* * * * *